(12) United States Patent
Tada et al.

(10) Patent No.: US 8,124,168 B2
(45) Date of Patent: Feb. 28, 2012

(54) SUBSTRATE PROCESSING METHOD AND SUBSTRATE PROCESSING APPARATUS

(75) Inventors: Kunihiro Tada, Nirasaki (JP); Hiroyuki Miyashita, Nirasaki (JP); Isao Gunji, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 733 days.

(21) Appl. No.: 11/667,945

(22) PCT Filed: Apr. 4, 2006

(86) PCT No.: PCT/JP2006/307081
§ 371 (c)(1),
(2), (4) Date: May 17, 2007

(87) PCT Pub. No.: WO2006/107036
PCT Pub. Date: Oct. 12, 2006

(65) Prior Publication Data
US 2007/0292598 A1   Dec. 20, 2007

(30) Foreign Application Priority Data
Apr. 4, 2005   (JP) .................................. 2005-107913

(51) Int. Cl.
C23C 16/46   (2006.01)
(52) U.S. Cl. .......................................... 427/8; 118/712
(58) Field of Classification Search ................ 427/8
See application file for complete search history.

(56) References Cited

U.S. PATENT DOCUMENTS

| | | | | |
|---|---|---|---|---|
| 4,969,748 A | * | 11/1990 | Crowley et al. | 374/1 |
| 5,436,172 A | * | 7/1995 | Moslehi | 374/121 |
| 5,912,096 A | * | 6/1999 | Hada | 430/30 |
| 6,853,802 B2 | * | 2/2005 | Neyret et al. | 392/416 |
| 6,994,750 B2 | * | 2/2006 | Tatsunari | 117/84 |
| 2002/0047536 A1 | * | 4/2002 | Ogawa et al. | 315/111.01 |

FOREIGN PATENT DOCUMENTS

| | | | |
|---|---|---|---|
| JP | 03278524 | * | 12/1981 |
| JP | 03278524 | * | 12/1991 |
| JP | 03278524 A | * | 12/1991 |
| JP | 5-47689 | | 2/1993 |
| JP | 5-195221 | | 8/1993 |
| JP | 6 158314 | | 6/1994 |
| JP | 8-45909 | | 2/1996 |
| JP | 2001 274109 | | 10/2001 |
| JP | 2003-500827 | | 1/2003 |
| JP | 2003 45818 | | 2/2003 |
| WO | 2004 042802 | | 5/2004 |

OTHER PUBLICATIONS

Eng. Abstr. of JP03278524, Dec. 1991, Japan, Morichika, Yoshimitsu.*
Translation of JP03278524, Dec. 1981, Japan, Morichika, Yoshimitsu.*

* cited by examiner

Primary Examiner — Elena T Lightfoot
(74) Attorney, Agent, or Firm — Oblon, Spivak, McClelland, Maier & Neustadt, L.L.P.

(57) ABSTRACT

Disclosed is a substrate processing method wherein the infrared absorptance or infrared transmittance of a substrate to be processed is measured in advance, and the substrate is processed according to the measured value while independently controlling temperatures at least in a first region located in the central part of the substrate and in a second region around the first region using temperature control means which are respectively provided for the first region and the second region and can be controlled independently from each other.

7 Claims, 9 Drawing Sheets

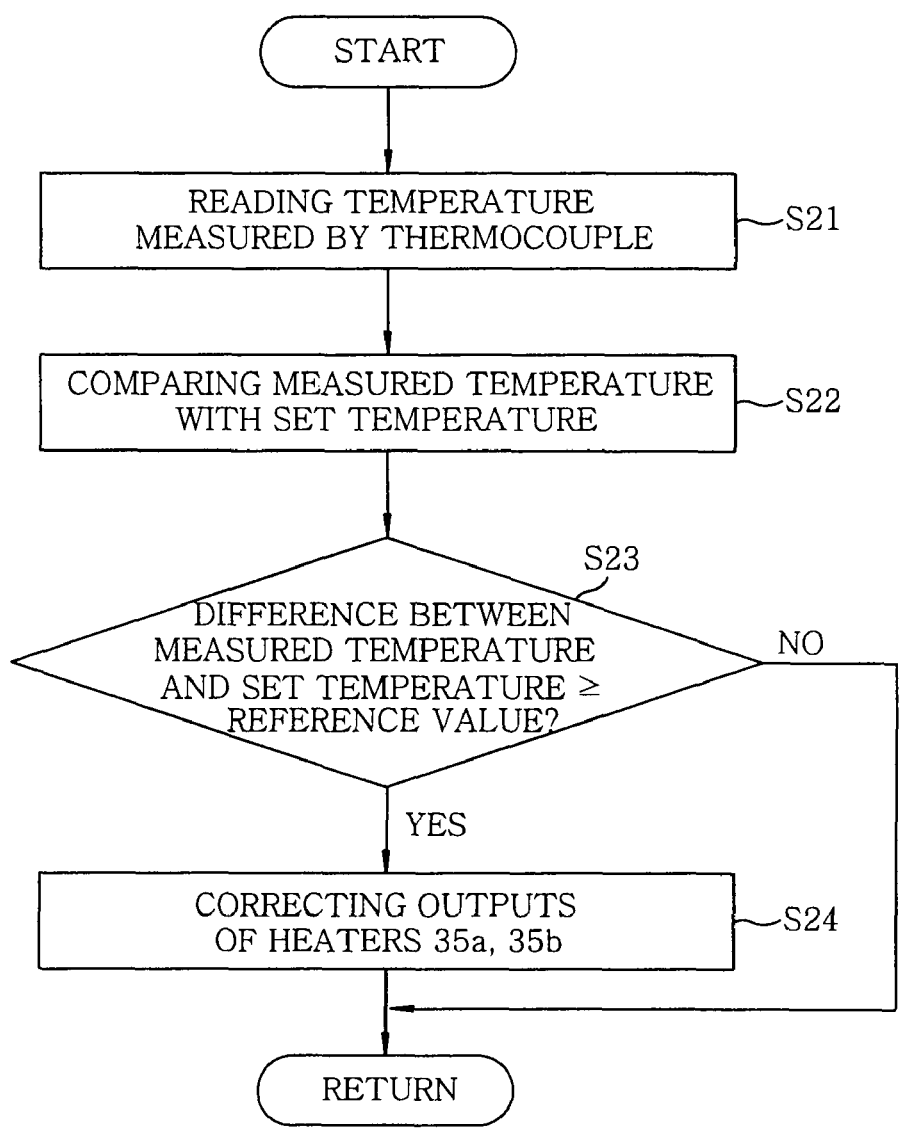

SUBSTRATE PROCESSING METHOD AND SUBSTRATE PROCESSING APPARATUS

FIELD OF THE INVENTION

The present invention relates to a substrate processing method and a substrate processing apparatus; and, more particularly, to a substrate processing method and a substrate processing apparatus for performing, e.g., a film forming process on a target substrate such as a semiconductor wafer.

BACKGROUND OF THE INVENTION

In a film forming process performed in manufacturing various semiconductor devices, a temperature control is vital to secure a desired characteristic of a thin film and a high precision in film thickness. Any problem in the temperature control can directly lead to deterioration of the quality or reliability of final semiconductor devices.

A film forming apparatus for forming a film on a semiconductor wafer (hereinafter, also referred to as "wafer") as a substrate to be processed by employing, e.g., a CVD method includes a susceptor serving as a substrate mounting table for mounting the wafer thereon, wherein the susceptor is formed of, e.g., a ceramic-based material such as AlN having a high thermal conductivity. While heating the wafer indirectly by way of heating the susceptor with heating units such as resistance heaters, various film forming reactions are made to be performed. Further, for the purpose of controlling the temperature of the wafer with a high precision during the film formation, the resistance heaters are grouped into two to correspond to, e.g., a central portion and a peripheral portion of the wafer, respectively, so that a heat transfer to the wafer can be conducted efficiently. Further, by installing a temperature detecting unit such as a thermocouple in the susceptor, the temperature distribution in the surface of the wafer can be improved and processing temperature uniformity among wafers can be realized.

However, if types of wafers (i.e., types of films formed on the wafers, types and concentrations of doped impurities therein, etc.) are different, thermal absorptances of the wafers can get different, so that it has been difficult to select an optimal temperature condition for every wafer when processing different types of wafers successively.

In practice, when heating different types of wafers successively, the temperature of the susceptor serving as a stage heater for heating the wafers behaves markedly differently depending on the presence or absence of films formed on the wafers, as shown in FIG. 1. Such behavior of the temperature of the susceptor is conjectured to be resulted from differences in thermal characteristics of the wafers, particularly, their thermal absorptances. Further, even in case the types of the wafers are identical, there may occur a difference in behaviors of the temperatures of, e.g., a central region and a peripheral region of the susceptor corresponding to the central portion and the peripheral portion of the wafers, respectively, which would result in deterioration in quality of the wafers after the film formation.

FIG. 3 is a graph showing measurement results of resistivities of a central portion (one position) and a peripheral portion (four positions) of each wafer after performing film formations on same types of wafers successively. As can been seen from FIG. 3, as the number of wafers processed increases, variations in resistivity become grater at the peripheral portions of the wafers while variations of resistivity at the central portions of the wafers are kept smaller. Variations in film qualities of wafers resulted from such in-surface temperature variations of the wafers can also be affected by external factors such as loading/unloading of the wafers, fluctuations of pressure in a processing chamber, deposits in the processing chamber, and so forth.

Accordingly, when selecting the temperature conditions, optimal heating conditions need to be selected by taking differences in positions on the surfaces of the wafers as well as differences in film types of the wafers into consideration.

As a technique for conducting a temperature control during a wafer processing, there is proposed a method for measuring infrared emissivity of a wafer and controlling a heating condition based on the measurement result (see, e.g., Japanese Patent Laid-open Publication No. 2003-45818: Reference 1, and Japanese Patent Laid-open Publication No. H6-158314: Reference 2).

In References 1 and 2, heating conditions are controlled on the basis of the types of wafers by measuring emissivities of the wafers. In these methods, though it is possible to improve inter-wafer reproducibility of processing, the technique to perform different controls depending on the areas of the wafers is not considered at all. Thus, the methods are insufficient to improve in-surface uniformity in a wafer (e.g., in-surface uniformity in quality and thickness of films formed on the wafer).

Further, since the susceptor typically has a temperature detecting unit such as the thermocouple, it is possible to perform a feedback control for a heater output while detecting a processing temperature. However, in case the temperature detecting unit cannot be installed at other locations than the central region of the susceptor due to a restriction from, e.g., a heater structure, it is impossible to correctly detect temperatures at the susceptor's other regions (for example, a peripheral region of the susceptor) where no temperature detecting unit is installed while the temperature of the central portion can be measured. As described above, since the temperature variation of the wafer tends to be great at the peripheral portion of the susceptor where no temperature detecting unit is provided, there is required a solution to this problem. With the conventional methods, however, it is difficult to correct heating conditions while improving the in-surface uniformity of the processing temperature for the wafer.

SUMMARY OF THE INVENTION

It is, therefore, an object of the present invention to provide a substrate processing method and a substrate processing apparatus capable of performing a high-precision processing by increasing precision of temperature control to improve a processing reproducibility between different types of wafers and also improve in-surface uniformity of processing for a wafer.

In accordance with a first aspect of the present invention, there is provided a substrate processing method for performing a target processing on a substrate to be processed, including the steps of:

measuring a thermal characteristic of the substrate to be processed in advance; and processing the substrate while controlling temperatures at plural regions of the substrate independently based on a measured value of the thermal characteristic.

In accordance with a second aspect of the present invention, there is provided a substrate processing method for performing a target processing on a substrate to be processed, including the steps of:

measuring a thermal characteristic of the substrate to be processed in advance; and processing the substrate while controlling heating temperatures of a plurality of heaters independently based on a measured value of the thermal characteristic, the heaters being disposed to correspond to plural regions of the substrate.

In accordance with a third aspect of the present invention, there is provided a substrate processing method for performing a target processing on a substrate to be processed, including the steps of:

measuring a thermal characteristic of the substrate to be processed in advance; determining an output ratio of a plurality of heaters disposed to correspond to plural regions of the substrate based on a measured value of the thermal characteristic; and heating the substrate by controlling outputs of the heaters based on the determined output ratio. In this case, the output ratio of the heaters may be at least one selected from a ratio of powers supplied to the heaters, a ratio of voltages supplied to the heaters, a ratio of currents supplied to heaters and a ratio of output times of the heaters.

In the first to the third aspect of the present invention, the thermal characteristic may be infrared transmittance or infrared absorptance.

Further, the plural regions may include at least a first region at a central portion of the substrate to be processed and a second region outside the first region.

Moreover, the substrate processing method may be a film forming method for forming a thin film on the substrate.

In accordance with a fourth aspect of the present invention, there is provided a substrate processing apparatus including:

a processing chamber for accommodating a substrate to be processed therein and performing a processing on the substrate;

a substrate mounting table for mounting the substrate on a mounting surface thereof in the processing chamber;

a temperature control unit for independently controlling temperatures at plural regions of the substrate mounted on the mounting table; and a controller for controlling the temperature control unit depending on a thermal characteristic of the substrate.

In the fourth aspect of the present invention, the thermal characteristic may be infrared transmittance or infrared absorptance.

Further, the plural regions may include at least a first region at a central portion of the substrate to be processed and a second region outside the first region. In this case, the temperature control unit may include resistance heaters buried in the substrate mounting table to correspond to the first and the second region, respectively; or lamp heaters disposed at locations distanced apart from the substrate to correspond to the first and the second region, respectively.

Moreover, the substrate processing apparatus may be a film forming apparatus for forming a thin film on the substrate.

In accordance with a fifth aspect of the present invention, there is provided a control program executable on a computer, wherein, the program is executed to control a substrate processing apparatus to perform a substrate processing method for processing a substrate to be processed which includes the steps of: measuring a thermal characteristic of the substrate to be processed in advance and controlling temperatures at plural regions of the substrate independently based on a measured value of the thermal characteristic.

In accordance with a sixth aspect of the present invention, there is provided a computer-readable storage medium for storing therein a control program executable on a computer, wherein, when executed, the control program controls a substrate processing apparatus to perform a substrate processing method for processing a substrate to be processed which includes the steps of: measuring a thermal characteristic of the substrate to be processed in advance and controlling temperatures at plural regions of the substrate independently based on a measured value of the thermal characteristic.

In accordance with the present invention, by measuring a thermal characteristic of the substrate to be processed in advance and controlling temperatures at plural regions of the substrate independently based on a measured value of the thermal characteristic, it is possible to improve a processing reproducibility between different types of wafers and also improve in-surface uniformity of processing for a wafer.

In other words, by measuring the thermal characteristic of a substrate to be processed, it is possible to perform a control corresponding to an inherent behavior of temperature variation of the substrate depending on the type of the substrate. Furthermore, the heating temperatures for the plural regions of the substrate are independently controlled by, e.g., the respective heaters, so that it is possible to prevent the variation of temperature in the surface of the substrate.

Accordingly, the temperature of the substrate can be controlled with a high precision to prevent, e.g., variation in resistivity (Rs) and nonuniformity of film thickness in the surface thereof, so that the quality of a semiconductor device and the like can be enhanced.

BRIEF DESCRIPTION OF THE DRAWINGS

FIG. 12 provides a flowchart to describe a processing routine of a temperature control during the film forming process.

DETAILED DESCRIPTION OF THE EMBODIMENTS

Hereinafter, exemplary embodiments of the present invention will be described with reference to the accompanying drawings.

Figure 4:
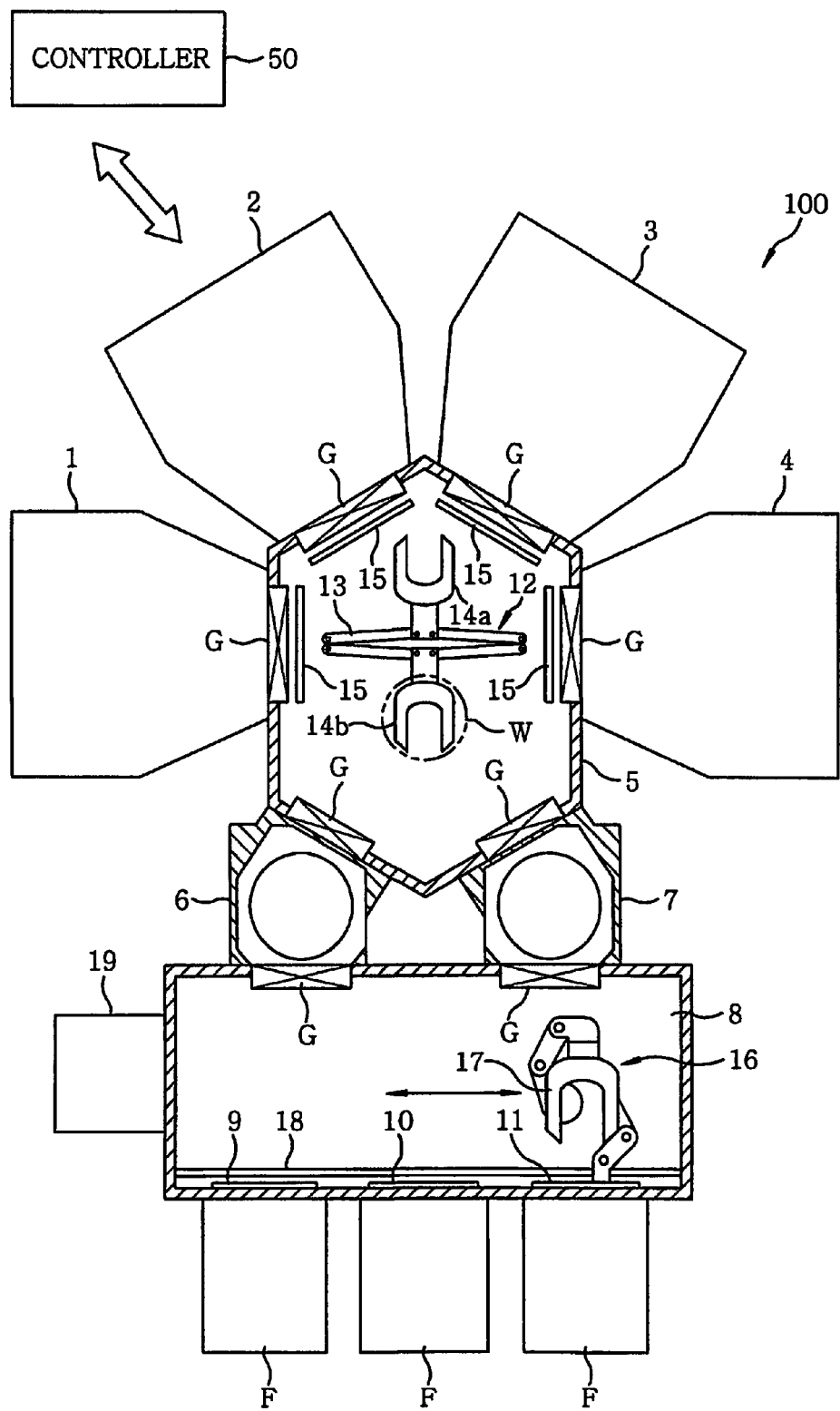
FIG. 4 illustrates a schematic configuration view of a multi-chamber type film forming system incorporating therein a TiN film forming apparatus for performing a processing method in accordance with the present invention.

FIG. 4 is a schematic configuration view of a multi-chamber type film forming system for performing a TiN film forming method as an example of a substrate processing method in accordance with the present invention.

As shown in FIG. 4, the film forming system 100 includes four film forming apparatuses: two Ti film forming apparatuses 1 and 2 for forming a Ti film on a wafer W by employing a CVD method and two TiN film forming apparatuses 3 and 4 for forming a TiN film on a wafer W. The film forming apparatuses 1 to 4 are disposed to correspond to four sides of a hexagonal wafer transfer chamber 5. Further, load lock chambers 6 and 7 are disposed at the remaining two sides of the wafer transfer chamber 5, and a wafer loading/unloading chamber 8 is connected to the load lock chambers 6 and 7 at the opposite side with respect to the wafer transfer chamber 5. The wafer loading/unloading chamber 8 has three ports 9 to 11 for mounting thereon three FOUPs F that accommodate wafers W therein. Further, the Ti film forming apparatuses 1 and 2 have a same structure, and the TiN film forming apparatuses 3 and 4 have a same structure.

As shown in FIG. 4, the Ti film forming apparatuses 1, 2, the TiN film forming apparatuses 3, 4, and the load lock chambers 6, 7 are respectively connected to the corresponding sides of the wafer transfer chamber 5 via gate valves G, and they are made to communicate with the wafer transfer chamber 5 by opening the corresponding valves G while they become isolated from the wafer transfer chamber 5 by closing the corresponding valves G. Furthermore, other gate valves G are respectively disposed at connection portions between the load lock chambers 6, 7 and the wafer loading/unloading chamber 8, and the load lock chambers 6, 7 are made to communicate with the wafer loading/unloading chamber 8 by opening the corresponding gate valves G, while they become isolated from the wafer loading/unloading chamber 8 by closing the corresponding valves G.

Disposed within the wafer transfer chamber 5 is a wafer transfer mechanism 12 for loading/unloading a wafer W into/from the Ti film forming apparatuses 1, 2, the TiN film forming apparatuses 3, 4, and the load lock chambers 6, 7. The wafer transfer mechanism 12 is provided substantially at the center of the wafer transfer chamber 5, and has a rotatable and extensible/contractible part 13 and two blades 14*a*, 14*b* for supporting the wafer W thereon, wherein the two blades 14*a*, 14*b* are disposed at leading ends of the rotatable and extensible/contractible part 13 to face opposite directions, respectively. Further, the inside of the wafer transfer chamber 5 is maintained at a preset vacuum level.

Moreover, sensor units 15 are disposed right in front of the respective gate valves corresponding to the Ti film forming apparatuses 1, 2 and the TiN film forming apparatuses 3, 4 in order to measure thermal characteristics of the wafer W, e.g., infrared transmittance (or infrared absorptance) of the wafer W. By providing the sensor units 15 for the respective process modules (the Ti film forming apparatuses 1, 2 and the TiN film forming apparatuses 3, 4), it is possible to detect the thermal characteristics of the wafer W that vary depending on the type of the wafer (a film type or a film thickness of the wafer; a type or a concentration of impurities; and so forth). Further, by installing the sensor units 15 outside the process modules, it is not necessary to change the hardware within the process modules.

Figure 5:
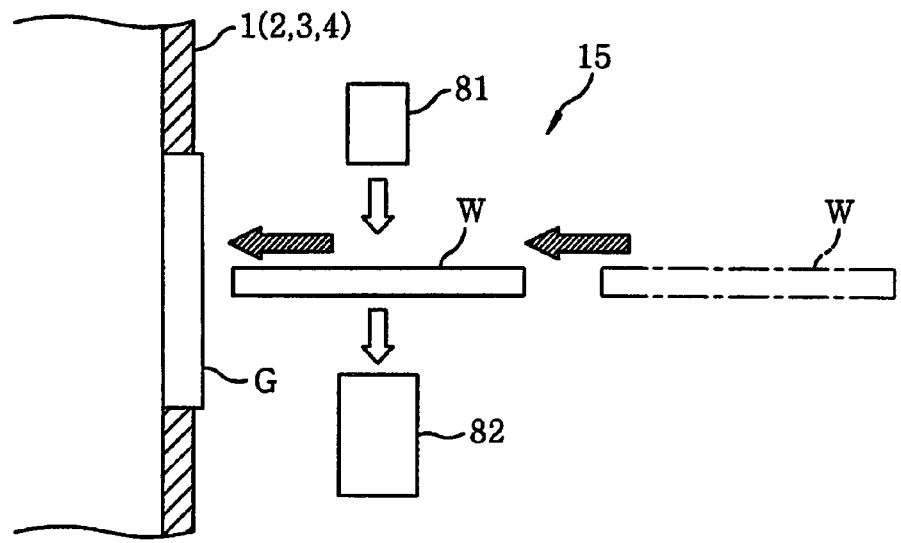
FIG. 5 shows an exemplary configuration of a sensor unit.
Figure 6:
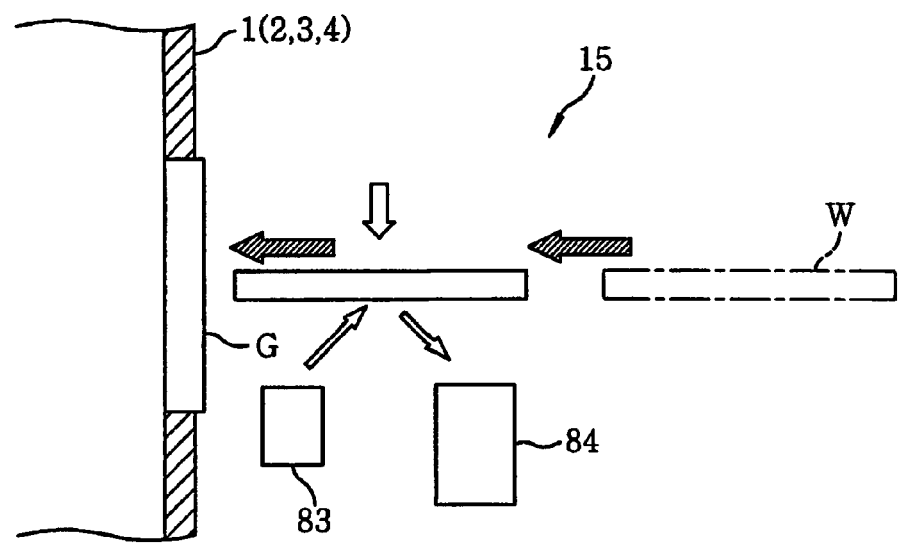
FIG. 6 illustrates another exemplary configuration of the sensor unit.

An exemplary configuration of the sensor unit 15 is illustrated in FIGS. 5 and 6. As shown in FIG. 5, the sensor unit 15 includes an infrared irradiation part 81; and a light receiving part 82 provided to face the infrared irradiation part 81 to detect the infrared intensity. The sensor unit 15 employs a method for measuring an intrinsic infrared transmittance of the wafer W by way of irradiating infrared rays to the wafer W when the wafer W passes between the infrared irradiation part 81 and the light receiving part 82. Alternatively, as shown in FIG. 6, the sensor unit 15 may employ a method including the steps of irradiating infrared rays to the wafer W from an infrared irradiation part 83; detecting a light reflected from the wafer W with a light receiving part 84; and then calculating infrared transmittance based on the detection result. Here, though the wavelengths of the infrared rays detected by the light receiving parts 82 and 84 are arbitrarily set, it is preferable to select, in advance through experiments, a wavelength at which measured intensities changes significantly from one type of wafer to another.

A HEPA filter (not shown) is provided at a ceiling portion of the wafer loading/unloading chamber 8, and clean air passing through the HEPA filter flows down to be supplied into the wafer loading/unloading chamber 8, so that the loading/unloading of the wafer W can be conducted in a clean air atmosphere of an atmospheric pressure. Each of three ports 9 to 11 of the wafer loading/unloading chamber 8 to which the FOUPs F are respectively attached is provided with a shutter (not shown). A FOUP accommodating wafers W therein or an empty FOUP is directly attached to each of the ports 9 to 11, and the shutters are opened after the attachment of the FOUPs, so that the FOUPs are allowed to communicate with the wafer loading/unloading chamber 8 while an inflow of exterior air is blocked. Furthermore, an alignment chamber 19 is provided at a side surface of the wafer loading/unloading chamber 8 to perform the alignment of the wafers W.

A wafer transfer unit 16 is disposed in the wafer loading/unloading chamber 8 to load and unload a wafer W into and from the FOUPs and the load lock chambers 6, 7. The wafer transfer unit 16 has a multi-joint arm structure and is configured to travel on a rail 18 along an arrangement direction of the FOUPs. The wafer transfer unit 16 transfers the wafer W while keeping the wafer W mounted on a hand 17 provided at a leading end thereof.

Figure 7:
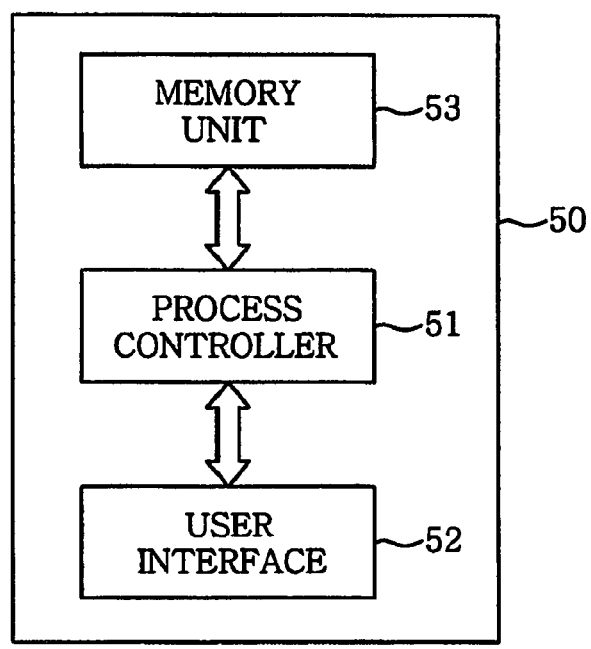
FIG. 7 offers a schematic configuration view of a controller.

The control of the entire film forming system 100 and the control of processing conditions of the Ti film forming apparatuses 1, 2 and the TiN film forming apparatuses 3, 4 are performed by a controller 50. FIG. 7 illustrates an exemplary configuration of the controller 50. The controller 50 includes a process controller 51 with a CPU; a user interface 52 having a keyboard with which an operator inputs commands to manage the film forming system 100, a display for showing an operational status of the plasma etching apparatus 100 and the like; and a memory unit 53 for storing therein recipes including control programs, processing condition data and the like to be used in performing various processings in the film forming system 100 under the control of the process controller 51. The process controller 51 is connected to the user interface 52 and the memory unit 53 to conduct transception of various signals and data therebetween.

Further, when a command is received through the user interface 52, the process controller 51 retrieves an arbitrary recipe from the memory unit 53 to execute it, so that a desired processing is performed in the film forming system 100 under the control of the process controller 51. The recipes including the control programs and the processing condition data may be stored in a computer-readable storage medium such as a CD-ROM, a hard disk, a flexible disk or the like, or may be retrieved by on-line through, for example, a dedicated line from another apparatus as desired.

In the film forming system 100 configured as described above, a single wafer W is first unloaded from one of the FOUPs by the wafer transfer unit 16 into the wafer loading/unloading chamber 8, which is maintained in a clean air atmosphere of an atmospheric pressure, and then the wafer W is loaded into the alignment chamber 19, where the wafer W is aligned. Thereafter, the wafer W is loaded into either one of the load lock chambers 6 and 7, and that load lock chamber is evacuated. Subsequently, the wafer W is unloaded from the load lock chamber by the wafer transfer mechanism 12 in the wafer transfer chamber 5 and is loaded into the Ti film forming apparatus 1 or 2. At this time, the wafer W supported on the blade 14*a* or 14*b* of the wafer transfer mechanism 12 passes through the sensor unit 15, and infrared transmittance of the wafer W prior to its entrance into the Ti film forming apparatus 1 or 2 is detected by the sensor unit 15. The measurement value of the infrared transmittance is transmitted to the controller 50. After a Ti film is formed on the wafer W in the Ti film forming apparatus 1 or 2, the wafer W is then unloaded from the Ti film forming apparatus 1 or 2 by the wafer transfer mechanism 12 and subsequently loaded into the TiN film forming apparatus 3 or 4. Here, as the wafer W is made to pass through the sensor unit 15 again while it is supported on the blade 14a or 14b of the wafer transfer mechanism 12, infrared transmittance of the wafer W having the Ti film thereon is detected by the sensor unit 15. Thereafter, a formation of a TiN film is carried out in the TiN film forming apparatus 3 or 4.

In forming a Ti film and a TiN film by using the Ti film forming apparatus 1 or 2 and the TiN film forming apparatus 3 or 4, respectively, heating conditions are set based on the measurement results of the sensor units 15, as will be described later. The wafer W having a film thereon is loaded into either one of the load lock chambers 6 and 7 by the wafer transfer mechanism 12, and the inside of that load lock chamber is returned to an atmospheric state. Then, the wafer W is unloaded from the load lock chamber by the wafer transfer unit 16 in the wafer loading/unloading chamber 8 to be put into one of the FOUPs. These series of operations are performed for wafers of a lot, and a set of processings is completed. Through such film forming process, a formation of a Ti film or a TiN film can be carried out.

Figure 8:
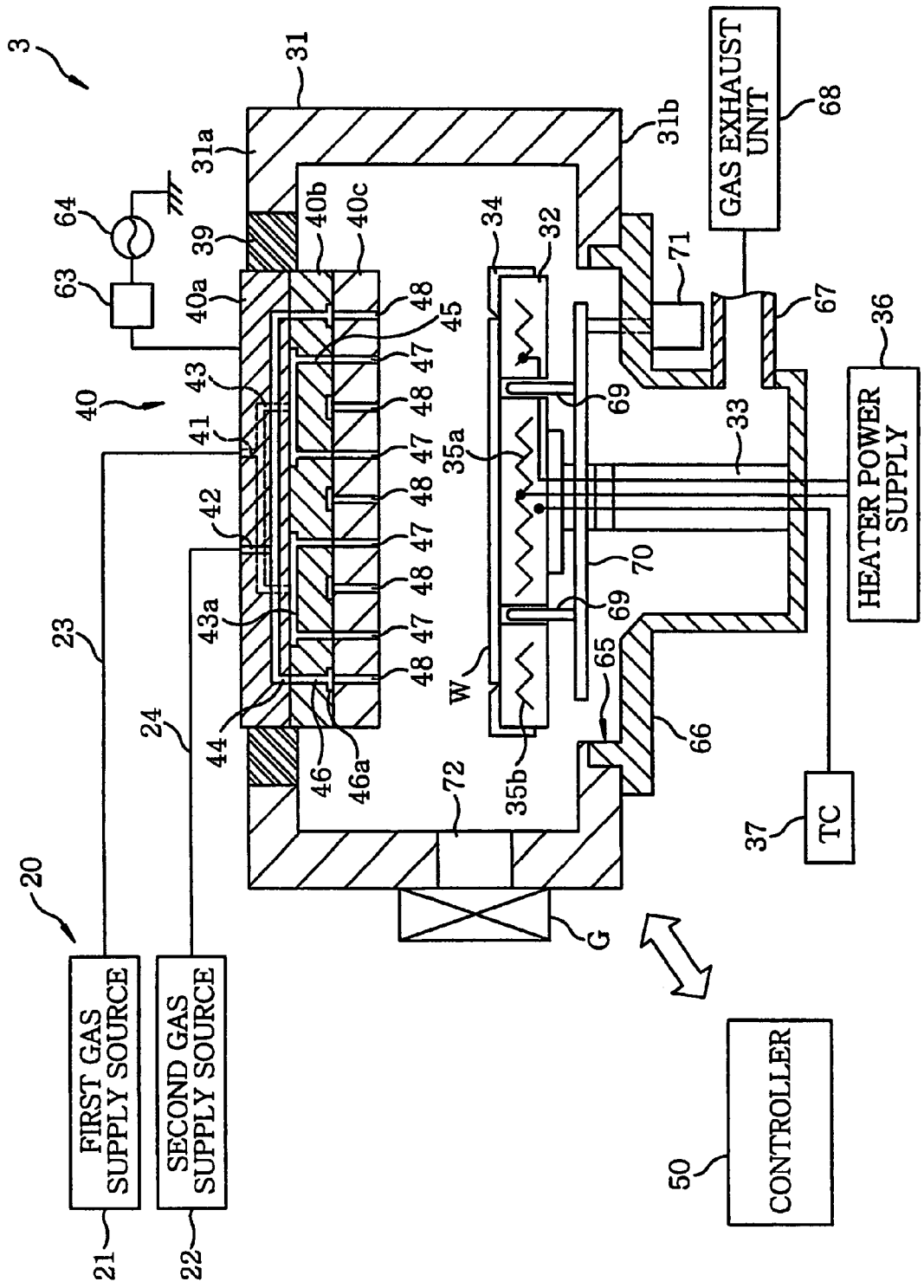
FIG. 8 provides a cross sectional view of the TiN film forming apparatus.

Now, for example, the TiN film forming apparatus 3 will be described in detail. Referring to FIG. 8, there is provided a cross sectional view showing a schematic configuration of the TiN film forming apparatus 3 in accordance with a first embodiment of the present invention. As mentioned above, the TiN film forming apparatus 4 has the same configuration as that of the TiN film forming apparatus 3. The TiN film forming apparatus 3 includes a substantially cylindrical chamber 31 which is configured hermetically, and a susceptor 32 for horizontally supporting a wafer W to be processed is disposed inside the chamber 31, the susceptor 32 being supported on a cylindrical support member 33 which is provided below a central portion of the susceptor 32. Further, a guide ring 34 for guiding the wafer W is provided at the peripheral portion of the susceptor 32.

Further, a heater 35a is buried in the central portion of the susceptor 32 corresponding to a central portion of the wafer W. Further, a ring-shaped heater 35b is buried in a peripheral portion of the susceptor 32 corresponding to a peripheral portion of the wafer W. The heaters 35a and 35b are resistance heaters for heating the wafer W to a specific temperature by powers supplied thereto from a heater power supply 36 individually. In this embodiment, considering that a temperature difference is likely to develop between the central portion and the peripheral portion of the wafer W, the two regions are individually controlled by using the heaters 35a and 35b. Further, the susceptor 32 may be formed of a ceramic, e.g., AlN, and in this case, ceramic heaters are employed.

Moreover, a thermocouple 37 serving as a temperature detector is connected to the central portion of the susceptor 32. The thermocouple 37 detects the temperature of the susceptor 32 and sends the detection result to the controller 50.

A shower head 40 is disposed at a ceiling wall portion 31a of the chamber 31 via an insulating member 39. The shower head 40 includes an upper block body 40a, an intermediate block body 40b and a lower block body 40c. The lower block body 40c is provided with gas injection openings 47 and 48 through which gases are injected, the gas injection openings 47 and 48 being alternately arranged. A first gas inlet opening 41 and a second gas inlet opening 42 are provided in the top surface of the upper block body 40a. A plurality of gas passages 43 branches off from the first gas inlet opening 41 in the upper block body 40a, and a multiplicity of gas passages 45 is formed in the intermediate bock body 40b. The gas passages 43 are made to communicate with the gas passages 45 via a multiplicity of horizontally elongated connection passages 43a. Further, the gas passages 45 are configured to communicate with the gas injection openings 47 of the lower block body 40c.

Further, a multiplicity of gas passages 44 branches off from the second gas inlet opening 42 in the upper block body 40a, and a plurality of gas passages 46 is formed in the intermediate block body 40b. The gas passages 44 are made to communicate with the gas passages 46. In addition, in the intermediate block body 40b, the gas passages 46 are connected with a multiplicity of horizontally elongated connection passages 46a, which are configured to communicate with the gas injection openings 48 of the lower block body 40c. The first and the second gas inlet opening 41 and 42 are connected to a gas line 23 and a gas line 24, respectively, which are extended from a gas supply unit 20.

The gas supply unit 20 is connected to a first gas supply source 21 and a second gas supply source 22. Though not shown, the first gas supply source 21 may include, for example, a $ClF_3$ gas supply source for supplying $ClF_3$ gas which is used as a cleaning gas; a $TiCl_4$ gas supply source for supplying $TiCl_4$ gas containing Ti; and an $N_2$ gas supply source for supplying $N_2$ gas. Further, though not shown, the second gas supply source 22 may include, for example, another $N_2$ gas supply source; and an $NH_3$ gas supply source for supplying $NH_3$ gas. Further, a mass flow controller and a valve (both are not shown) are installed on each of the gas supply lines 23 and 24.

A high frequency power supply 64 is connected to the shower head 40 via a matching unit 63 to supply a high frequency power to the shower head 40 as desired. Although the high frequency power supply 64 is not typically necessary, it is possible to perform a film formation by converting a gas supplied in the chamber 31 through the shower head 40 into plasma by way of supplying a high frequency power from the high frequency power supply 64 if it is desired to increase the reactivity of a film forming reaction.

A circular hole 65 is formed in a bottom wall 31b of the chamber 31, and a gas exhaust chamber 66 is provided such that it covers the hole 65 while protruding downward. A gas exhaust line 67 is connected to a side wall of the gas exhaust chamber 66, and a gas exhaust unit 68 is connected to the gas exhaust line 67. By operating the gas exhaust unit 68, the chamber 31 can be depressurized to a specific vacuum level.

Three wafer supporting pins 69 for supporting the wafer W to elevate it (only two of them are shown) are provided at the susceptor 32 such that they can be protruded above and retreated below the surface of the susceptor 32. Specifically, the wafer supporting pins 69 are fixed at a supporting plate 70. Further, the wafer supporting pins 69 are elevated with the supporting plate 70 by a driving unit 71 such as an air cylinder.

Provided in a sidewall of the chamber 31 is a loading/unloading port 72 for allowing a loading/unloading of a wafer W into or from the wafer transfer chamber 5. Through opening/closing a gate valve G, the loading/unloading of the wafer W is performed.

Now, a method for forming a TiN film by using the above-described TiN film forming apparatus will be described with reference to FIGS. 9 to 12.

Figure 9:
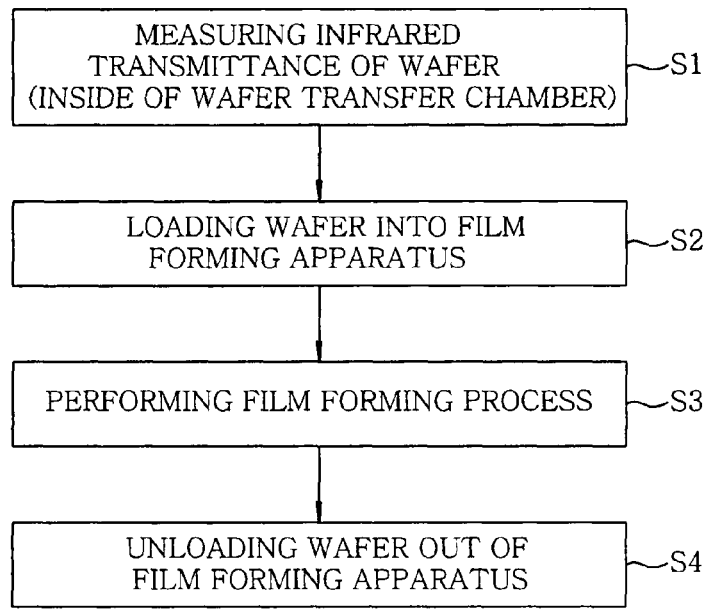
FIG. 9 presents a flowchart to describe major processing steps of a film forming process.

FIG. 9 provides a flowchart to describe major processing steps in forming the TiN film. In the TiN film forming process, the susceptor 32 is first heated up to a specified temperature level ranging from, e.g., 500 to 700° C. by using the heaters 35a and 35b, and the inside of the chamber 31 is exhausted by the gas exhaust unit 68. In this state, the gate valve G is opened, and a wafer W is made to pass through the sensor unit 15 while being mounted on the blade 14a or 14b of the wafer transfer mechanism 12 in the wafer transfer chamber 5 under a vacuum state, so that the infrared transmittance (or an infrared absorptance) of the wafer W is detected (step S1). Here, it is preferable to detect the infrared transmittance of every wafer W by using the sensor unit 15. However, in case plural wafers W of a same type are processed in a single lot, for example, it may be allowed to detect the infrared transmittance of a single wafer W of the lot.

The wafer W that has passed through the sensor unit 15 is directly loaded into the chamber 31 via the loading/unloading port 72 (step S2).

Thereafter, after mounting the wafer W on the supporting pins 69, the blade 14a or 14b of the transfer mechanism 12 is retreated from the chamber 31, and the gate valve G is closed. Subsequently, e.g., $N_2$ gas is supplied into the chamber 31 via the shower head 40, and the wafer W is pre-heated. After completing the pre-heating step, the supply of the $N_2$ gas is stopped, and the wafer supporting pins 69 are moved downward so that the wafer W is mounted on the susceptor 32. Then, $N_2$ gas and $NH_3$ gas are supplied into the chamber 31, while their respective flow rates are gradually increased until the internal pressure of the chamber 31 reaches a specified pressure level. While maintaining such state for a preset time period, a second pre-heating step is conducted. After the second pre-heating step, $TiCl_4$ gas is supplied into the chamber 31 preferably at a preset flow rate while the flow rates of the $N_2$ gas and the $NH_3$ gas are kept at specified levels, respectively. Then, while maintaining the flow rates of the gases and the internal pressure of the chamber 31, the TiN film forming process is carried out (step S3).

In the film forming step S3, a TiN film is formed to have a desired thickness ranging from, e.g., 5 to 100 nm. Here, the heating temperature for the wafer W is set to range from, e.g., 300 to 700° C.; and, preferably, set to be about 600° C. For the heating of the wafer W, outputs of the heater power supply 36 are controlled such that temperatures of a first region, i.e., a central portion of the wafer W and a second region, i.e., a peripheral portion of the wafer W outside the central portion thereof are individually controlled by means of the heaters 35a and 35b. Further, while performing the film forming step, it is preferable to convert a processing gas into plasma by supplying a high frequency power from the high frequency power supply 64 to increase the reactivity thereof. A high frequency power of 200 to 1000 W, preferably, 200 to 500 W, having a frequency ranging from 450 kHz to 60 MHz, preferably 450 kHz to 13.56 MHz, is supplied in case of using plasma.

After completing the film forming step, the supply of the $NH_3$ gas and the $TiCl_4$ gas is stopped, and the chamber 31 is purged by flowing $N_2$ gas therethrough as a purge gas. Thereafter, if necessary, it is preferable to perform a nitride treatment of the surface of the TiN thin film by supplying $N_2$ gas and $NH_3$ gas into the chamber 31 at specified flow rates, respectively. Thereafter, the wafer supporting pins 69 are elevated to lift up the wafer W, and the gate valve G is opened to allow the blade 14a or 14b of the transfer mechanism 12 to be inserted into the chamber 31. Then, by lowering the wafer supporting pins 69, the wafer W is mounted on the blades 14a or 14b to be unloaded into the wafer transfer chamber 5 (Step S4).

After forming TiN thin films on a preset number of wafers W through the above-described process, a cleaning of the chamber 31 can be performed, if necessary, by supplying $ClF_3$ gas into the chamber 31 from a $ClF_3$ gas supply source of the first gas supply source 21.

Figure 10:
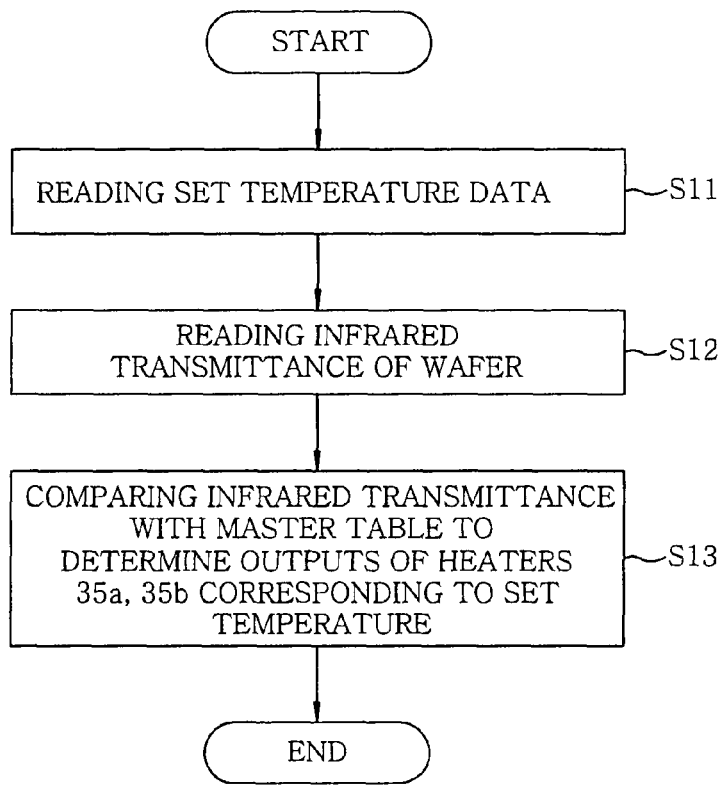
FIG. 10 sets forth a flowchart to describe a processing sequence of a temperature control.

FIG. 10 presents a flowchart to describe a processing sequence for controlling the heaters 35a and 35b under the control of the controller 50 based on a measurement of a thermal characteristic of the wafer W obtained by the sensor unit 15.

First, in step S11, a preset film forming temperature (set temperature) for the wafer W is obtained by the process controller 51. Specifically, the processing controller 51 reads a set temperature that has been inputted from the user interface 52 of the controller 50 and stored in, e.g., the memory unit 53. Further, it is also possible to read a recipe containing information on the set temperature from the memory unit 53 or a storage medium.

Next, in step S12, infrared transmittance of the wafer W to be processed is obtained by the process controller 51. As described above, the infrared transmittance of the wafer W is detected while the wafer W passes through the sensor unit 15 in the wafer transfer chamber 5 before the wafer W is loaded into the TiN film forming apparatus 3 or the like (the step S1 in FIG. 9). The infrared transmittance detected by the sensor unit 15 is immediately sent to the controller 50 and temporarily stored in the memory unit 53 to be retrieved later.

Figure 11:
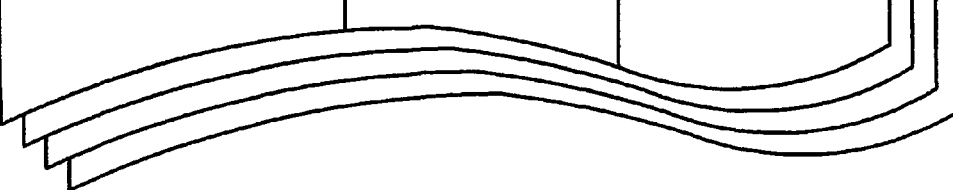
FIG. 11 describes the scheme of master table.

Then, in step S13, the process controller 51 compares the infrared transmittance thus obtained with those in a master table which has been prepared in advance and determines outputs of the heater power supply 36 to the heaters 35a and 35b individually. The master table used herein is illustrated in FIG. 11. The master table in FIG. 11 shows relationships of infrared transmittances of the wafer W and output ratios of the heaters 35a and 35b for each set temperature. Specifically, in a case where a processing is performed at a specific set temperature and the infrared transmittance is, e.g., $A_1$, a ratio of heater outputs at the central portion (heater 35a) and the peripheral portion (heater 35b) is set to be 1:0.97. Further, in a case where the infrared transmittance is, e.g., $A_5$, a ratio of heater outputs at the central portion and the peripheral portion is set to be 1:0.90. Here, the output ratio of the heaters 35a and 35b may be, for example, a ratio of powers supplied thereto, a ratio of voltages supplied thereto, a ratio of currents supplied thereto, a ratio of output times thereof, or the like. Further, it is also possible to combine more than one of those heater output parameters.

For example, the master table can be prepared by measuring the temperatures of the central portion and the peripheral portion of the susceptor 32 on which a sample wafer whose infrared transmittance has already been measured is mounted, and then relating the measurements with the outputs of the heaters 35a and 35b. In practice, in case of heating the wafer W through thermal conductance from the susceptor 32, the temperature distribution of the wafer W shows that the temperature at the peripheral portion of the wafer W tends to rise more easily than that at the central portion thereof. This tendency is found to become stronger as the infrared transmittance of the wafer W gets smaller. Accordingly, if infrared transmittances of two wafers are, e.g., $A_1$ and $A_5$ ($A_5<A_1$), the wafer W of $A_5$ tends to absorb heat more easily than the wafer W of $A_1$ and the temperature of the peripheral portion is likely to increase compared with the central portion. Accordingly, it is preferable to control the output of the heater 35b corresponding to the peripheral portion of the wafer W to be reduced.

Moreover, the master table shown in FIG. 11 may be prepared based on a simulation including a control model, e.g., a computer fluid dynamics (CFD) simulation including radiative thermal conduction. The master table may be stored as a part of recipes in the memory unit 53 of the controller 50 or in a storage medium.

Further, though the master table shown in FIG. 11 is prepared for the respective set temperatures, it is also possible to use master table defined for each temperature range including a plurality of set temperatures in a case where differences in the output ratios of the heaters 35a and 35b are small between the set temperatures.

Moreover, every time a single wafer W passes through the sensor unit 15, the series of processing steps shown in FIG. 10 are performed to determine outputs of the heaters 35a and 35b for each wafer W depending on the type (film type, etc.) of the wafer, so that the heating processing can be optimized. Thus, an inter-wafer reproducibility of processing can be obtained for various types of wafers W and thermal unbalance in the surface of the wafer W can be prevented, so that it is possible to solve non-uniformity problems of processing such as fluctuations in the thickness and quality of films being formed. Further, for example, in case of setting a processing temperature for each lot, the step 11 in FIG. 10 can be omitted in processing the wafers W in each lot.

FIG. 12 provides a flowchart to describe a temperature control routine in the film forming process that is carried out by the controller 50 based on the output controls of the heaters 35a and 35b as described above. Further, prior to starting the film forming process, the wafer W has already been heated by supplying powers to the heaters 35a and 35b from the heater power supply source at output ratios determined by using the master table based on the set temperature.

Further, the thermocouple 37 is installed at the central portion of the susceptor 32 to serve as a temperature detector for continuously detecting the temperature of the susceptor 32 during the film forming process, whereby the process controller 51 can obtain a temperature measurement value at any time (step S21).

Then, the temperature measurement value thus obtained is compared with the set temperature (step S22), and it is determined in step S23 whether the difference between the measurement value and the set temperature is equal to or greater than a specified reference level (temperature width) If it is determined in the step S23 that the difference between the measured temperature and the set temperature is equal to or greater than the reference level (YES), the process controller 51 sends a control signal to the heater power supply 36 so that the outputs to the heaters 35a and 35b are corrected in accordance with the control signal (step S24). In case of the TiN film forming apparatus 3 shown in FIG. 8, since the thermocouple 37 is only provided at one location corresponding to the central portion of the susceptor 32, i.e., to the first region (central portion) of the wafer W, only a temperature measurement value of the central portion of the susceptor 32 can be obtained. In the master table in FIG. 11, however, the output ratio of the heaters 35a and 35b is optimally distributed considering the thermal characteristics of the central portion and the peripheral portion of the wafer W being processed, as described before. In performing the correction at the step S24, it is preferable to increase or decrease the outputs of the heaters 35a and 35b while maintaining the specific output ratio thereof, so that the temperature control during the film forming process can be carried out easily. Further, in performing the correction at the steps S24, it is also possible to vary the output ratio of the heaters 35a and 35b by controlling either one or both of the outputs of the heaters 35a and 35b.

Meanwhile, if it is determined in the step S23 that the difference between the measured temperature and the set temperature is less than the reference level (NO), the processing proceeds without correcting the outputs of the heaters 35a and 35b.

The steps S21 to S24 are repetitively performed during the film forming process, so that the temperature control accuracy in the film forming process can be improved.

The present invention is not limited to the embodiment described above, but may be modified variously. For example, in the above-described embodiment, there has been exemplified the film forming apparatus for forming a thin film on a wafer, the present invention may also be applied to other various semiconductor manufacturing apparatuses which require a highly precise temperature control.

Further, a substrate to be processed is not limited to the semiconductor wafer, but it may be, e.g., a substrate for a liquid crystal display (LCD) or the like and may be a substrate having a film layer thereon.

Moreover, in the film forming system 100 in accordance with the embodiment of the present invention, though the sensor unit 15 is installed for each of the process modules in the wafer transfer chamber 5, the locations of the sensor units 15 are not limited particularly as long as they are located such that a wafer W necessarily passes therethrough. Further, the sensor units 15 may be provided not to correspond to the process modules, i.e., they may be provided at separate locations where the wafer W necessarily passes therethrough. For example, a sensor unit may be provided at the alignment chamber 19 in FIG. 4 to detect infrared transmittance (or infrared absroptance) of every wafer w that passes through it. Moreover, it is also possible to install sensor units in the load lock chambers 6 and 7 to detect infrared transmittance (or infrared absorptance) of every wafer W that passes through them to be loaded into the wafer transfer chamber 5 from the wafer loading/unloading chamber 8. In such a case, the measurement results of the infrared transmittance (or infrared absorptance) of the wafers in the alignment chamber 19 or the load lock chambers 6 and 7 are stored in the memory unit 53, and at a time when the wafer W is loaded into each process module, the process controller 51 reads out the stored measurement results and uses them in the control of the output ratio of the heaters 35a and 35, as similar to the above.

Figure 1:
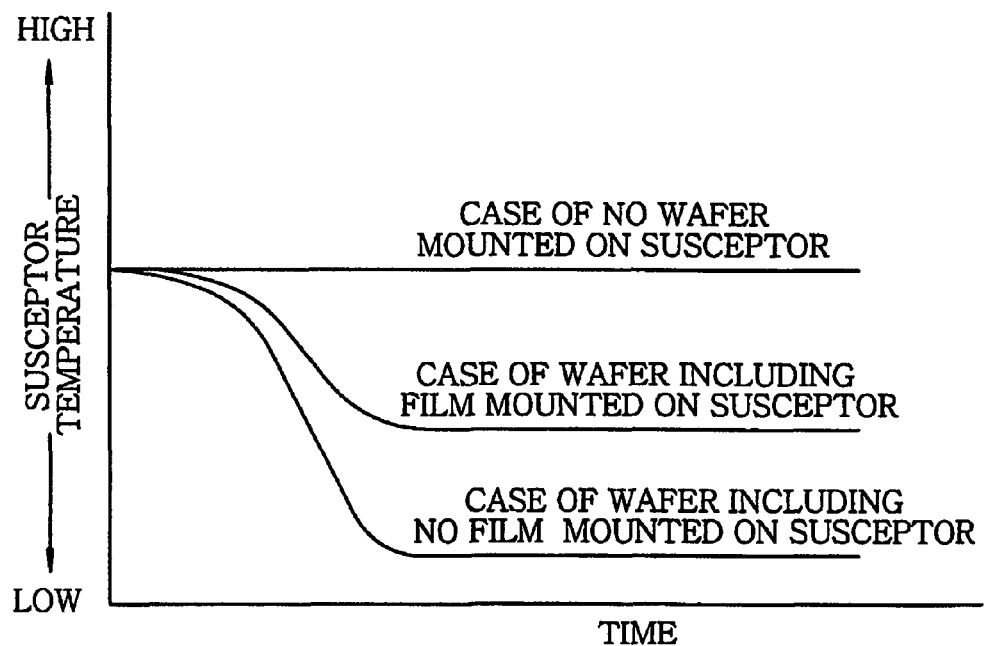
FIG. 1 provides a graph to describe a difference in behaviors of susceptor temperatures depending on types of wafers.
Figure 2:
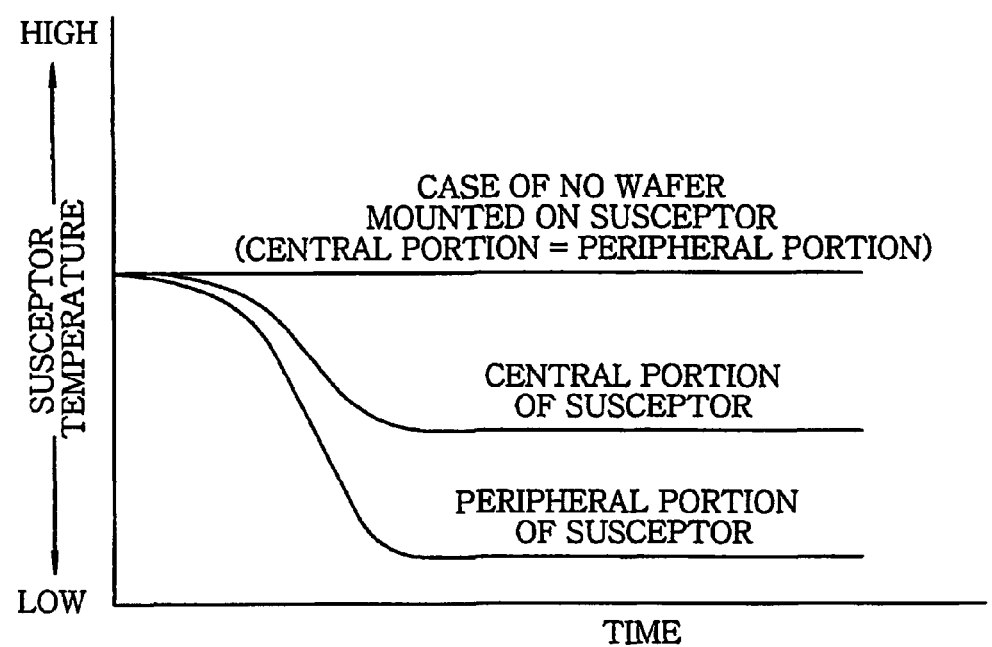
FIG. 2 sets forth a graph to describe a difference in behaviors of susceptor temperatures depending on areas of the susceptor.
Figure 3:
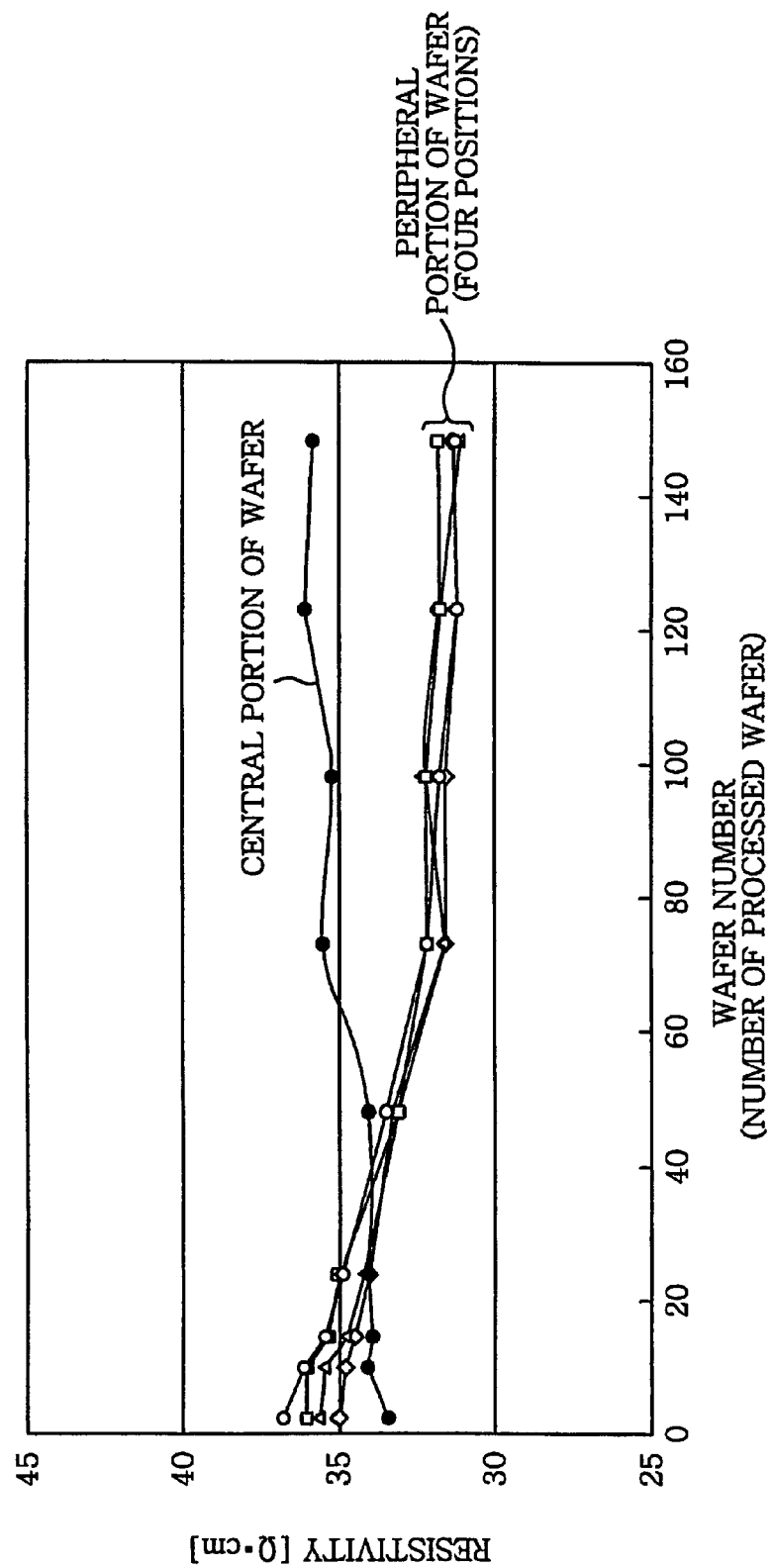
FIG. 3 presents a graph to describe a variation of resistivity depending on the number of wafers processed.

Furthermore, though the TiN film forming apparatus 3 shown in FIG. 3 employs the resistance heaters buried in the susceptor 32 as a temperature control unit, the type of the heaters is not limited thereto. For example, lamp heaters may be employed instead, and the lamp heaters may be installed at locations distanced apart from the wafer W to face the susceptor 32.

Moreover, in the above-described embodiment, though the entire region of the wafer W is divided into the central portion and the peripheral portion and the output of the heater 35b corresponding to the peripheral portion is varied by using the master table, it is also possible to vary the output of the heater 35a corresponding to the central portion or to vary the outputs of both of them.

Further, the area of the wafer W may be divided into more than two regions, and the regions may be heated by individual heaters whose temperatures can be controlled independently.

INDUSTRIAL APPLICABILITY

The present invention can be employed, e.g., in forming a film on a substrate such as a semiconductor wafer while controlling the temperature of the substrate, for example, in a manufacturing process of various semiconductor devices.

What is claimed is:

1. A substrate processing method for performing a target processing on a substrate mounted on a susceptor in a processing chamber at one of various set temperatures, comprising:
    irradiating infrared rays to the substrate and receiving infrared rays reflected from or transmitted through the substrate to measure a thermal characteristic of the substrate, the thermal characteristic being a single value of infrared transmittance or infrared absorptance for the whole substrate, wherein the irradiating and the receiving the infrared rays are performed outside the processing chamber;
    determining an output ratio of an output of at least one of the plurality of heaters to an output of at least another one of the plurality of heaters for said one of the set temperatures based on the measured thermal characteristic, the heaters being disposed to correspond to plural regions of the substrate, wherein the output ratio of the heaters is determined by using a table which has relationships between thermal characteristics of the substrate and output ratios of the heaters for each of the set temperatures, wherein each relationship in the table associates a respective single value of the thermal characteristic of the whole substrate to a respective output ratio of an output of at least one of the plurality of heaters to an output of at least another one of the plurality of heaters; and
    heating the substrate in the processing chamber by controlling outputs of the heaters based on the determined output ratio, wherein the outputs of the heaters are controlled, while maintaining the determined output ratio, based on the difference between said one of the set temperatures and a temperature measured by only one temperature detector provided at a region of the susceptor corresponding to only one of the plural regions of the substrate.

2. The method of claim 1, wherein the output ratio of the heaters is at least one selected from a ratio of powers supplied to the heaters, a ratio of voltages supplied to the heaters, a ratio of currents supplied to the heaters and a ratio of output times of the heaters.

3. The method of claim 1, wherein the plural regions include at least a first region at a central portion of the substrate; and a second region outside the first region.

4. The method of claim 1, wherein the method is a film forming method for forming a thin film on the substrate.

5. The method of claim 1, wherein the irradiating the infrared rays to the substrate is carried out by using an infrared light having a wavelength which produces significantly different thermal characteristics for substrates of different types.

6. The method of claim 1, wherein the thermal characteristic of the substrate is measured in front of the processing chamber while being loaded thereinto.

7. The method of claim 1, wherein said only one of the plural regions of the substrate is a central portion of the substrate.

* * * * *